(12) United States Patent
Jang

(10) Patent No.: US 12,443,108 B2
(45) Date of Patent: Oct. 14, 2025

(54) SUBSTRATE TREATING APPARATUS

(71) Applicant: SEMES CO., LTD., Cheonan-si (KR)

(72) Inventor: Ho Jin Jang, Cheonan-si (KR)

(73) Assignee: Semes Co., LTD., Chungcheongnam-do (KR)

( * ) Notice: Subject to any disclaimer, the term of this patent is extended or adjusted under 35 U.S.C. 154(b) by 194 days.

(21) Appl. No.: 17/831,935

(22) Filed: Jun. 3, 2022

(65) Prior Publication Data

US 2022/0390859 A1 Dec. 8, 2022

(30) Foreign Application Priority Data

Jun. 7, 2021 (KR) .................. 10-2021-0073629

(51) Int. Cl.
*G03F 7/30* (2006.01)

(52) U.S. Cl.
CPC .......... *G03F 7/3092* (2013.01); *G03F 7/3021* (2013.01)

(58) Field of Classification Search
CPC .................................................. G03F 7/3092
See application file for complete search history.

(56) References Cited

U.S. PATENT DOCUMENTS

| | | | | |
|---|---|---|---|---|
| 2002/0041935 A1* | 4/2002 | Inada | ............... | H01L 21/67017 427/427.3 |
| 2005/0247265 A1* | 11/2005 | Devine | ............... | H01L 21/6719 427/248.1 |
| 2017/0028450 A1* | 2/2017 | Goda | ...................... | B08B 13/00 |
| 2022/0205090 A1* | 6/2022 | Kim | .................. | H01L 21/67161 |

FOREIGN PATENT DOCUMENTS

| | | | | | |
|---|---|---|---|---|---|
| JP | H0534428 | U | * | 5/1993 | |
| JP | H1055995 | A | * | 2/1998 | |
| JP | 2000156341 | A | * | 6/2000 | |
| JP | 2013026490 | A | * | 2/2013 | ....... H01L 21/67034 |
| KR | 10-2010-0046798 | A | | 5/2010 | |
| KR | 100993669 | B1 | | 11/2010 | |

(Continued)

OTHER PUBLICATIONS

Machine translation of KR-20170078189-A (Year: 2017).*

(Continued)

*Primary Examiner* — Steven H Whitesell
(74) *Attorney, Agent, or Firm* — Harness, Dickey & Pierce, P.L.C.

(57) ABSTRACT

The present invention provides a substrate treating apparatus. The substrate treating apparatus includes: a first process chamber having a first treatment space therein; a second process chamber having a second treatment space therein; and an exhaust unit exhausting atmospheres of the first treatment space and the second treatment space, in which the exhaust unit includes: an integrated exhaust line; a first exhaust line connecting the first process chamber and the integrated exhaust line; a second exhaust line connecting the second process chamber and the integrated exhaust line; and a partition wall partitioning a partial section of a flow path within the integrated exhaust line into a first flow path through which a fluid exhausted through the first exhaust line flows and a second flow path through which a fluid discharged through the second exhaust line flows.

16 Claims, 10 Drawing Sheets

(56) References Cited

FOREIGN PATENT DOCUMENTS

| KR | 101010158 B1 | 1/2011 |
| --- | --- | --- |
| KR | 10-2017-0078189 A | 7/2017 |
| KR | 20170078189 A * | 7/2017 |
| KR | 10-2019-0022997 A | 3/2019 |

OTHER PUBLICATIONS

Machine translation of JP-2000156341-A (Year: 2000).*
Machine translation of Jp H10-55995-A (Year: 1998).*
Machine translation of JP-2013026490-A (Year: 2013).*
Machine translation of JP-H0534428-U (Year: 1993).*
Korean Office Action dated Dec. 10, 2022 issued in corresponding Korean Appln. No. 10-2021-0073629.
Chinese Office Action dated Mar. 28, 2025 for corresponding Chinese Application No. 202210641356.8.

* cited by examiner

SUBSTRATE TREATING APPARATUS

CROSS-REFERENCE TO RELATED APPLICATIONS

This application claims priority to and the benefit of Korean Patent Application No. 10-2021-0073629 filed in the Korean Intellectual Property Office on Jun. 7, 2021, the entire contents of which are incorporated herein by reference.

TECHNICAL FIELD

The present invention relates to a substrate treating apparatus, and more particularly, to a substrate treating apparatus performing a developing process.

BACKGROUND ART

In order to manufacture a semiconductor device, various processes, such as cleaning, deposition, photography, etching, and ion implantation, are performed. Among the processes, the photography process includes a coating process of forming a film by applying a photoresist, such as a photoresist, on a surface of the substrate, an exposure process that transfers a circuit pattern to a film formed on the substrate, and a developing process that selectively removes a film formed on the substrate in a region on which the exposure process has been performed or a region opposite to the region.

FIG. 1 is a diagram schematically illustrating a general substrate treating apparatus. Referring to FIG. 1, a substrate treating apparatus 8000 includes a first process chamber 8100 and a second process chamber 8200. The first process chamber 8100 includes a first treatment container 8110 having a treatment space, a first support unit 8120 supporting and rotating a substrate W in the treatment space, and a first exhaust line 8130 for exhausting atmosphere of the treatment space. The second process chamber 8200 includes a second treatment container 8210 having a treatment space, a second support unit 8220 supporting and rotating the substrate W in the treatment space, and a second exhaust line 8230 for exhausting atmosphere of the treatment space. The first exhaust line 8130 and the second exhaust line 8230 are connected to an integrated exhaust line 8300. The first exhaust line 8130, the second exhaust line 8230, and a decompression unit 9000 are sequentially disposed. The fluids exhausted from each of the first exhaust line 8130 and the second exhaust line 8230 flow in the direction in which the decompression unit is installed in the integrated exhaust line.

Accordingly, the first exhaust line 8130 is located farther from the decompression unit 9000 with respect to the integrated exhaust line 8300 than the second exhaust line 8230, so that in the first process chamber 8100, the exhaust to the treatment space does not proceed relatively smoothly, compared to the second process chamber 8200. In addition, the flow of the airflow in the integrated exhaust line 8300 introduced from the first exhaust line 8130 and the flow of the airflow in the integrated exhaust line 8300 introduced from the second exhaust line 8230 collide at point A, resulting in occurring vortexes. Due to this, an internal pressure of the second process chamber 8200 to which the second exhaust line 8230 is connected is changed. The internal atmosphere of the second process chamber 8200 is not smoothly exhausted.

That is, the decompression unit 9000 is located relatively farther from the first process chamber 8100 than the second process chamber 8200, so that the exhaust of the first process chamber 8100 is relatively less smooth than that of the second process chamber 8200. In addition, vortexes are formed due to the collision of airflows in the portion where the second exhaust line 8230 is connected in the integrated exhaust line 8300. Exhaust of the internal atmosphere of the second process chamber 8200 does not proceed smoothly. Accordingly, it is difficult to control the pressure of the internal treatment space for each of the process chambers performing the developing process. A variation in internal pressure occurs in each of the process chambers, thereby causing process defects during the development process.

SUMMARY OF THE INVENTION

The present invention has been made in an effort to provide a substrate treating apparatus capable of reducing exhaust interference between a plurality of process chambers.

The present invention has also been made in an effort to provide a substrate treating apparatus capable of resolving deviation in internal pressure between a plurality of process chambers.

The object of the present invention is not limited thereto, and other objects not mentioned will be clearly understood by those of ordinary skill in the art from the following description.

An exemplary embodiment of the present invention provides a substrate treating apparatus, including: a first process chamber having a first treatment space therein; a second process chamber having a second treatment space therein; and an exhaust unit exhausting atmospheres of the first treatment space and the second treatment space, in which the exhaust unit includes: an integrated exhaust line; a first exhaust line connecting the first process chamber and the integrated exhaust line; a second exhaust line connecting the second process chamber and the integrated exhaust line; and a partition wall partitioning a partial section of a flow path within the integrated exhaust line into a first flow path through which a fluid exhausted through the first exhaust line flows and a second flow path through which a fluid discharged through the second exhaust line flows.

According to the exemplary embodiment, the partition wall may be provided to partition the first flow path and the second flow path by a predetermined distance along a longitudinal direction of the integrated exhaust line.

According to the exemplary embodiment, a decompression unit is installed in the integrated exhaust line, and the first exhaust line, the second exhaust line, and the decompression unit are sequentially disposed along the longitudinal direction of the integrated exhaust line.

According to the exemplary embodiment, the exhaust unit may further include: a first damper adjusting an exhaust flow rate of the first flow path; and a second damper adjusting an exhaust flow rate of the second flow path.

According to the exemplary embodiment, one end of the partition wall may be in contact with a first sidewall of inner walls of the integrated exhaust line between the first exhaust line and the second exhaust line, and the other end of the partition wall may be located between the first sidewall and a second sidewall facing the first sidewall.

According to the exemplary embodiment, each of the first exhaust line and the second exhaust line may be connected to the first sidewall, and between a first point adjacent to the second exhaust line among points where the first exhaust line and the first sidewall are connected and a second point adjacent to the first exhaust line among points where the second exhaust line and the first sidewall are connected, one end of the partition wall may be located to closer to the second point.

According to the exemplary embodiment, the partition wall may include: a first portion extending from one end of the partition wall; and a second portion extending from the first portion to the other end of the partition wall, and the first portion may be provided to be inclined downward in a direction from an upstream to a downstream of the integrated exhaust line, and the second portion may extend from the first portion in a direction toward the downstream of the integrated exhaust line.

According to the exemplary embodiment, the first portion may extend from one end of the partition wall to a midpoint between the first sidewall and the second sidewall.

According to the exemplary embodiment, each of the first process chamber and the second process chamber may be provided to perform a developing process on a substrate.

Another exemplary embodiment of the present invention provides a substrate treating apparatus, including: a first process chamber having a first treatment space; a second process chamber having a second treatment space; a transfer robot transferring a substrate to the first process chamber or the second process chamber; and an exhaust unit exhausting atmospheres of the first treatment space and the second treatment space, in which the first process chamber includes: a first treatment container providing the first treatment space; a first support unit supporting and rotating the substrate in the first treatment space; and a first developer supply unit supplying a developer onto the substrate, and the second process chamber includes: a second treatment container providing the second treatment space; a second support unit supporting and rotating the substrate in the second treatment space; and a second developer supply unit supplying a developer on the substrate, and the exhaust unit includes: an integrated exhaust line; a first exhaust line connecting the first process chamber and the integrated exhaust line; a second exhaust line connecting the second process chamber and the integrated exhaust line; and a partition wall partitioning a first flow path through which a fluid exhausted through the first exhaust line flows and a second flow path through which a fluid exhausted through the second exhaust line flows by a predetermined distance along a longitudinal direction of the integrated exhaust line in the integrated exhaust line.

According to the exemplary embodiment, a decompression unit providing negative pressure to the integrated exhaust line may be installed in the integrated exhaust line, and the first exhaust line, the second exhaust line, and the decompression unit may be sequentially disposed along the longitudinal direction of the integrated exhaust line.

According to the exemplary embodiment, the exhaust unit may further include: a first damper adjusting an exhaust flow rate of the first flow path; and a second damper adjusting an exhaust flow rate of the second flow path.

According to the exemplary embodiment, one end of the partition wall may be in contact with a first sidewall of inner walls of the integrated exhaust line between the first exhaust line and the second exhaust line, and the other end of the partition wall may be located between the first sidewall and a second sidewall facing the first sidewall.

According to the exemplary embodiment, each of the first exhaust line and the second exhaust line may be connected to the first sidewall, and between a first point adjacent to the second exhaust line among points where the first exhaust line and the first sidewall are connected and a second point adjacent to the first exhaust line among points where the second exhaust line and the first sidewall are connected, one end of the partition wall may be located to closer to the second point.

According to the exemplary embodiment, between a first point adjacent to the second exhaust line among points where the first exhaust line and the first sidewall are connected and a second point adjacent to the first exhaust line among points where the second exhaust line and the first sidewall are connected, one end of the partition wall may be located to closer to the second point.

According to the exemplary embodiment, the first portion may extend from one end of the partition wall to a midpoint between the first sidewall and the second sidewall.

According to the exemplary embodiment, the exhaust unit may further include: a first valve opening and closing the first exhaust line or adjusting the exhaust flow rate; and a second valve opening and closing the second exhaust line or adjusting the exhaust flow rate.

Still another exemplary embodiment of the present invention provides a substrate treating apparatus, including: a first process chamber having a first treatment space therein; a second process chamber having a second treatment space therein; and an exhaust unit exhausting atmospheres of the first treatment space and the second treatment space, in which the exhaust unit includes: an integrated exhaust line; a first exhaust line connecting the first process chamber and the integrated exhaust line; a second exhaust line connecting the second process chamber and the integrated exhaust line; and a partition wall preventing exhaust interference between the first process chamber and the second process chamber, and a decompression unit is installed in the integrated exhaust line and the first exhaust line, the second exhaust line, and the decompression unit are sequentially disposed along a longitudinal direction of the integrated exhaust line, in the integrated exhaust line, a first flow path through which a fluid exhausted through the first exhaust line flows and a second flow path through which a fluid exhausted through the second exhaust line flows are provided, and the partition wall partitions the first flow path and the second flow path by a predetermined distance along a longitudinal direction of the integrated exhaust line.

According to the exemplary embodiment, the exhaust unit may further include: a first damper adjusting an exhaust flow rate of the first flow path; and a second damper adjusting an exhaust flow rate of the second flow path.

According to the exemplary embodiment, each of the first exhaust line and the second exhaust line may be connected to a first sidewall of inner walls of the integrated exhaust line, and the partition wall may include: a first portion extending from one end that is in contact with the first sidewall between the first exhaust line and the second exhaust line; and a second portion extending from the first portion to the other end located between the first sidewall and a second sidewall facing the first sidewall, and the first portion may be provided to be inclined downward in a direction from an upstream to a downstream of the integrated exhaust line, and the second portion may extend in a direction toward a downstream of the integrated exhaust line.

According to the exemplary embodiment of the present invention, it is possible to reduce exhaust interference between a plurality of process chambers.

Further, according to the exemplary embodiment of the present invention, it is possible to provide the substrate treating apparatus capable of resolving variations in internal pressure between a plurality of process chambers.

The effect of the present invention is not limited to the foregoing effects, and those skilled in the art may clearly understand non-mentioned effects from the present specification and the accompanying drawings.

DETAILED DESCRIPTION

Figure 1:
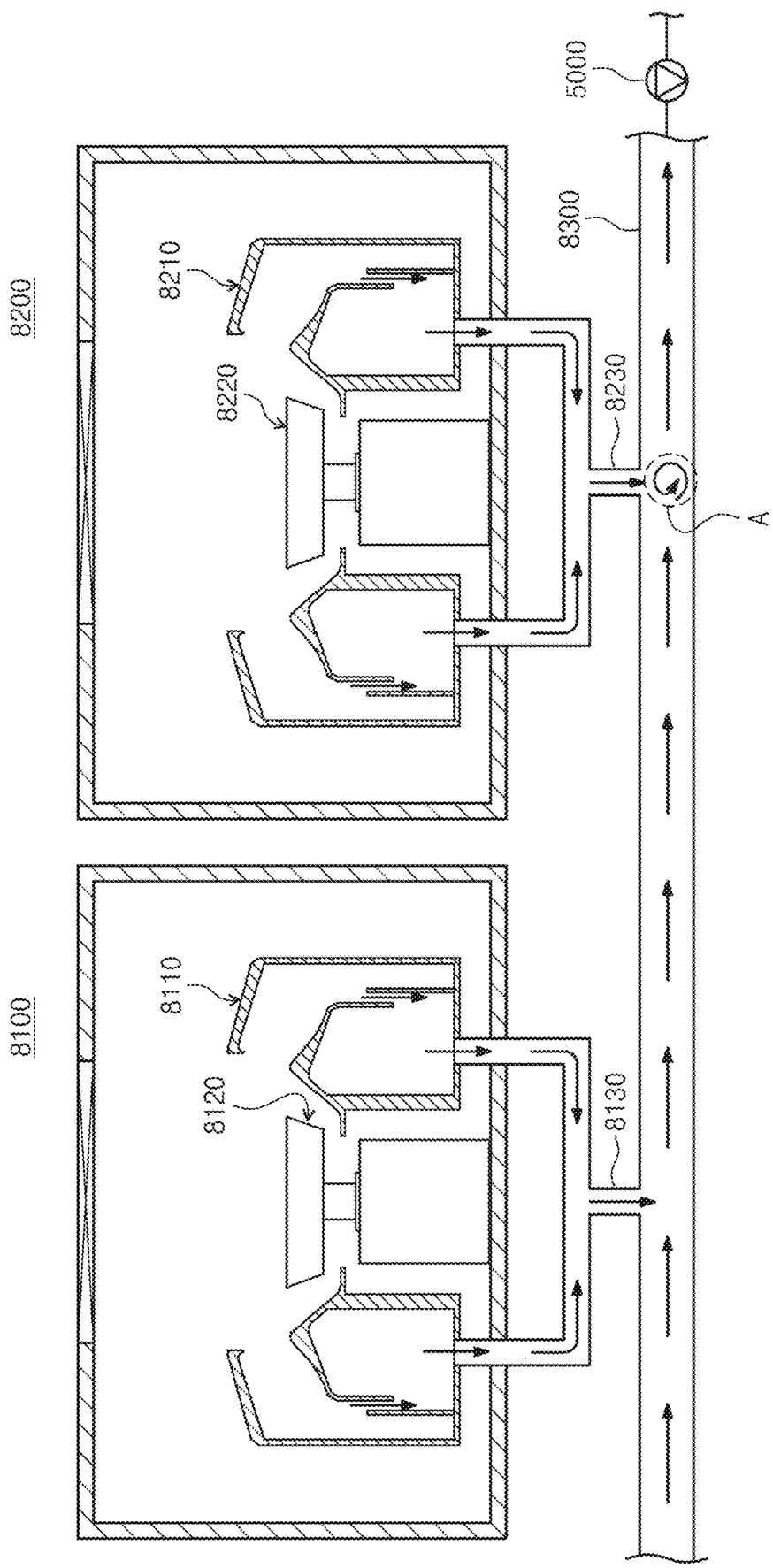
FIG. 1 is a cross-sectional view schematically illustrating a process chamber of a general substrate treating apparatus.

Hereinafter, an exemplary embodiment of the present invention will be described in more detail with reference to the accompanying drawings. An exemplary embodiment of the present invention may be modified in various forms, and the scope of the present invention should not be construed as being limited by the exemplary embodiment described below. The present exemplary embodiment is provided to more completely explain the present invention to those skilled in the art. Therefore, the shapes of components in the drawings are exaggerated to emphasize a clearer description.

Hereinafter, an example of the present invention will be described in detail with reference to FIGS. 2 to 11.

Figure 2:
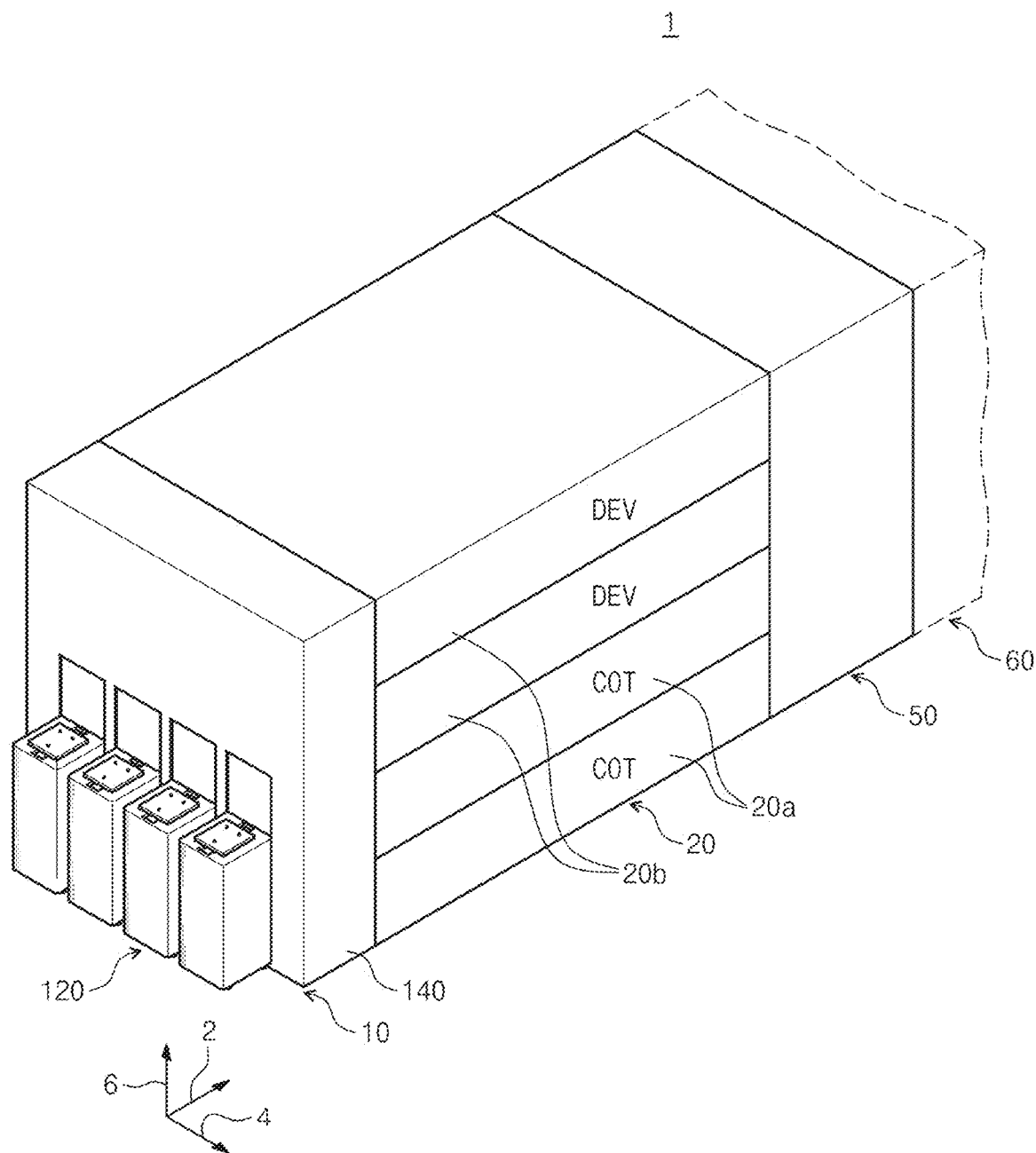
FIG. 2 is a perspective view schematically illustrating a substrate treating apparatus according to an exemplary embodiment of the present invention.
Figure 3:
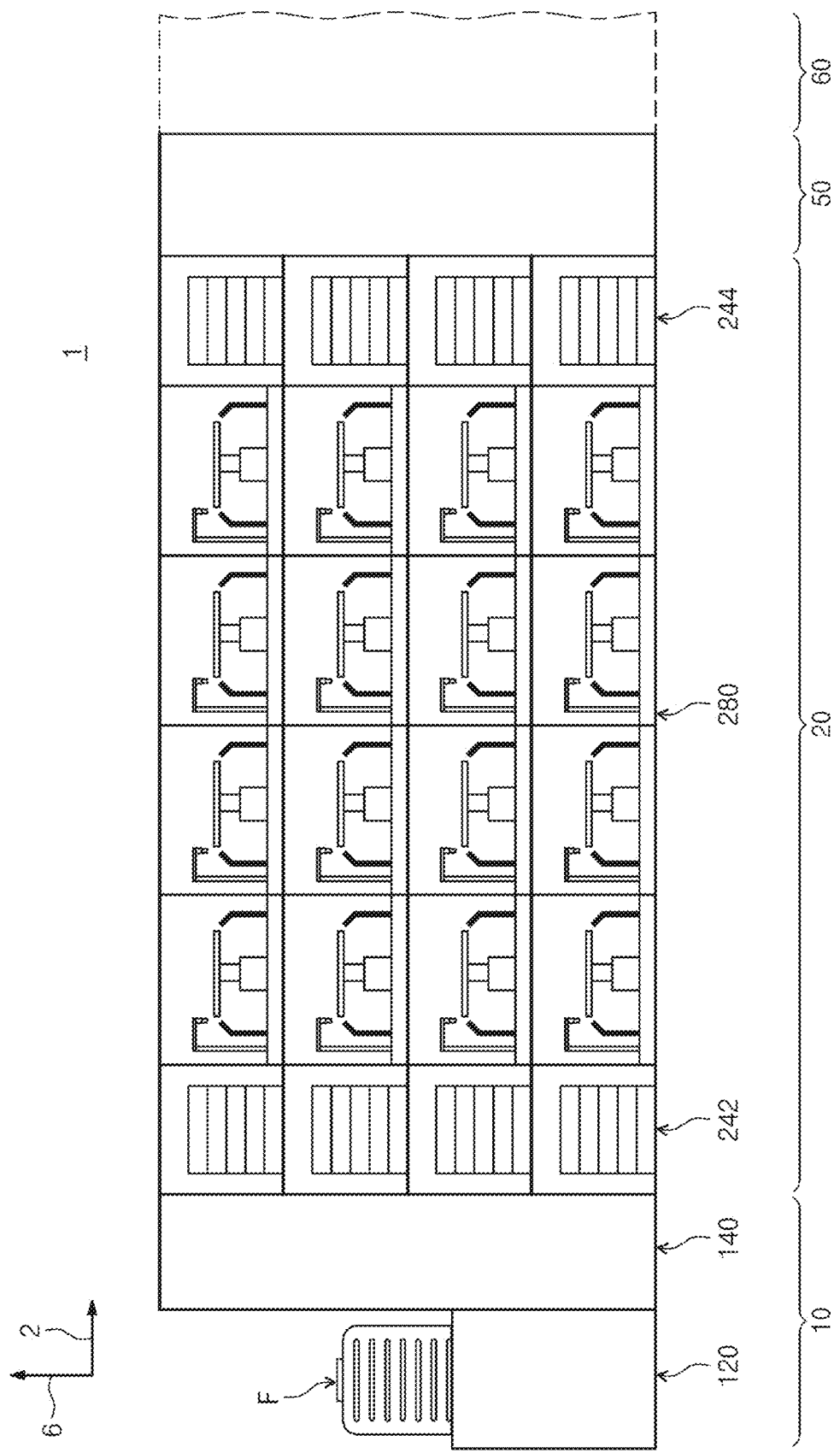
FIG. 3 is a front view of the substrate treating apparatus showing a coating block or a developing block of FIG. 2.
Figure 4:
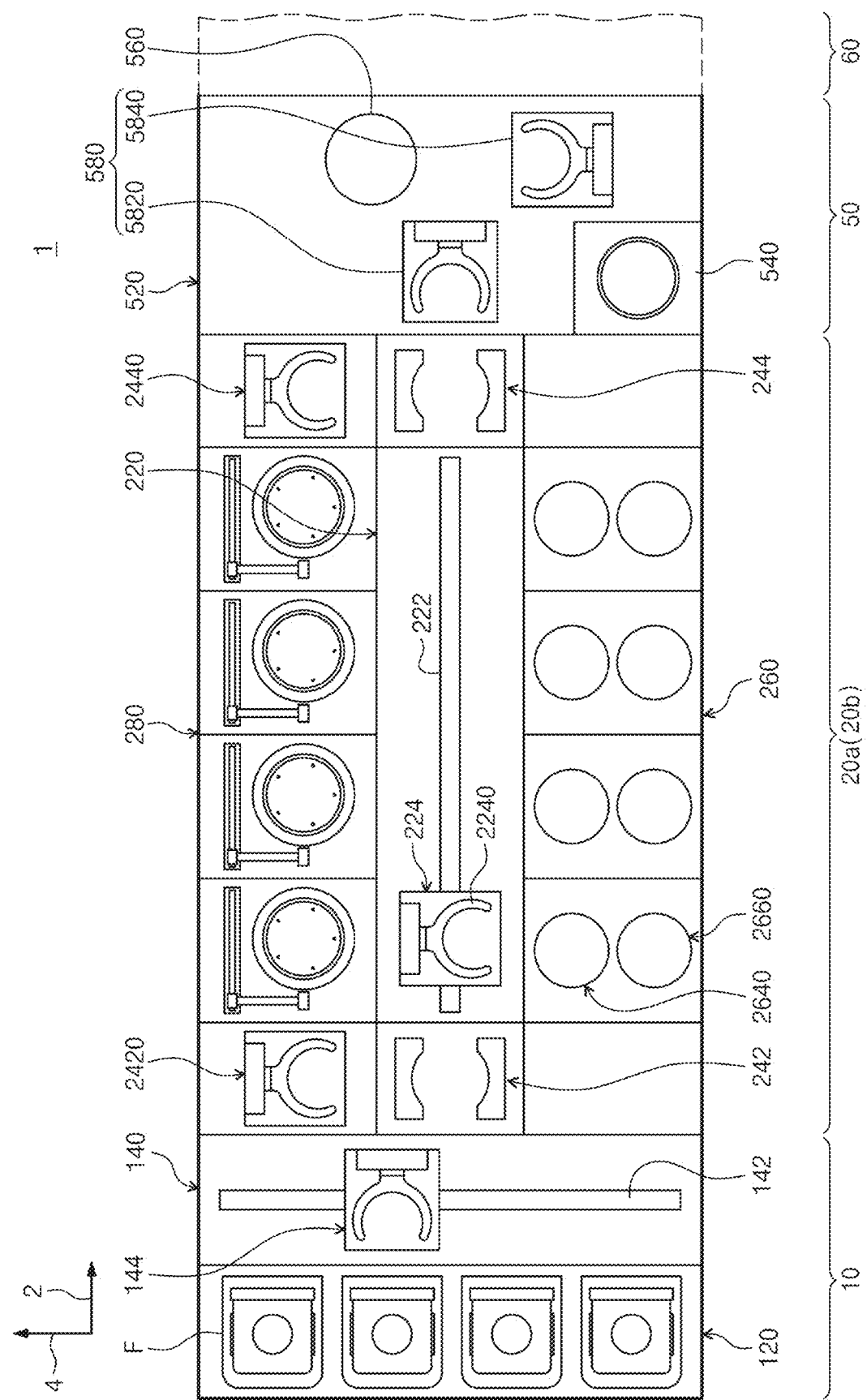
FIG. 4 is a top plan view of the substrate treating apparatus of FIG. 2.

FIG. 2 is a perspective view schematically illustrating a substrate treating apparatus according to an exemplary embodiment of the present invention, and FIG. 3 is a front view of the substrate treating apparatus of FIG. 2. FIG. 4 is a top plan view of the substrate treating apparatus of FIG. 2.

Referring to FIGS. 2 to 4, a substrate treating apparatus 1 includes an index module 10, a treating module 20, and an interface module 50. According to an embodiment, the index module 10, the treating module 20, and the interface module 50 are sequentially arranged in a line. Hereinafter, a direction in which the index module 10, the processing module 20, and the interface module 50 are arranged is defined as a first direction 2, a direction perpendicular to the first direction 2 when viewed from the top is defined as a second direction 4, and a direction perpendicular to the plane including both the first direction 2 and the second direction 4 is defined as a third direction 6.

The index module 10 transfers a substrate W to the treating module 20 which treats the substrate W from a container F in which the substrate W is accommodated. The index module 10 accommodates the substrate W that has been completely treated in the treating module 20 into the container F. A longitudinal direction of the index module 10 is the second direction 4. The index module 10 includes a load port 110 and an index frame 140.

The container F in which the substrate W is accommodated is seated in the load port 120. The load port 120 is located at an opposite side of the treating module 20 based on the index module 140. A plurality of load ports 120 may be provided, and the plurality of load ports 120 may be arranged in a line along the second direction 4. The number of load ports 120 may be increased or decreased according to process efficiency of the treating module 20 and a condition of foot print, and the like.

A plurality of slots (not illustrated) for accommodating the plurality of substrates W in a state where the substrates W are arranged horizontally with respect to the ground may be formed in the container F. As the container F, a Front Opening Unified Pod (FOUP) may be used. The container F may be placed on the load port 120 by a transfer means (not illustrated), such as an overhead transfer, an overhead conveyor, or an automatic guided vehicle, or an operator.

An index rail 142 and an index robot 144 are provided inside the index frame 140. The index rail 142 is provided inside the index frame 140 so that a longitudinal direction is the second direction 4. The index robot 144 may transfer the substrate W. The index robot 144 may transfer the substrate W between the index module 10 and a buffer chamber 240 to be described later. The index robot 144 may include an index hand 1440. The substrate W may be placed on the index hand 1440. The index hand 1440 may include an index base 1442 having an annular ring shape in which a part of a circumference is symmetrically bent, and an index support part 1444 that moves the index base 1442. The configuration of the index hand 1440 is the same as or similar to that of a transfer hand 2240, which will be described later. The index hand 1440 may be provided to be movable in the second direction 4 on the index rail 142. Therefore, the index hand 1440 is movable forward and backward along the index rail 142. Further, the index hand 1440 may be provided to be rotatable about the third direction 6 and be movable in the third direction 6.

The treating module 20 may receive the substrate W accommodated in the container F and perform a coating process and a developing process on the substrate W. The processing module 20 includes a coating block 20a and a developing block 20b. The coating block 20a performs a coating process on the substrate W. The developing block 20b performs a developing process on the substrate W. A plurality of coating blocks 20a are provided, and the coating blocks 20a are provided to be stacked on each other. A plurality of developing blocks 20b are provided, and the developing blocks 20b are provided to be stacked on each other. According to the embodiment of FIG. 3, two coating blocks 20a are provided, and two developing blocks 20b are provided. The application blocks 20a may be disposed below the developing blocks 20b. According to an example, the two coating blocks 20a perform the same process, and may be provided in the same structure. Also, the two developing blocks 20b may perform the same process as each other, and may be provided in the same structure.

Figure 5:
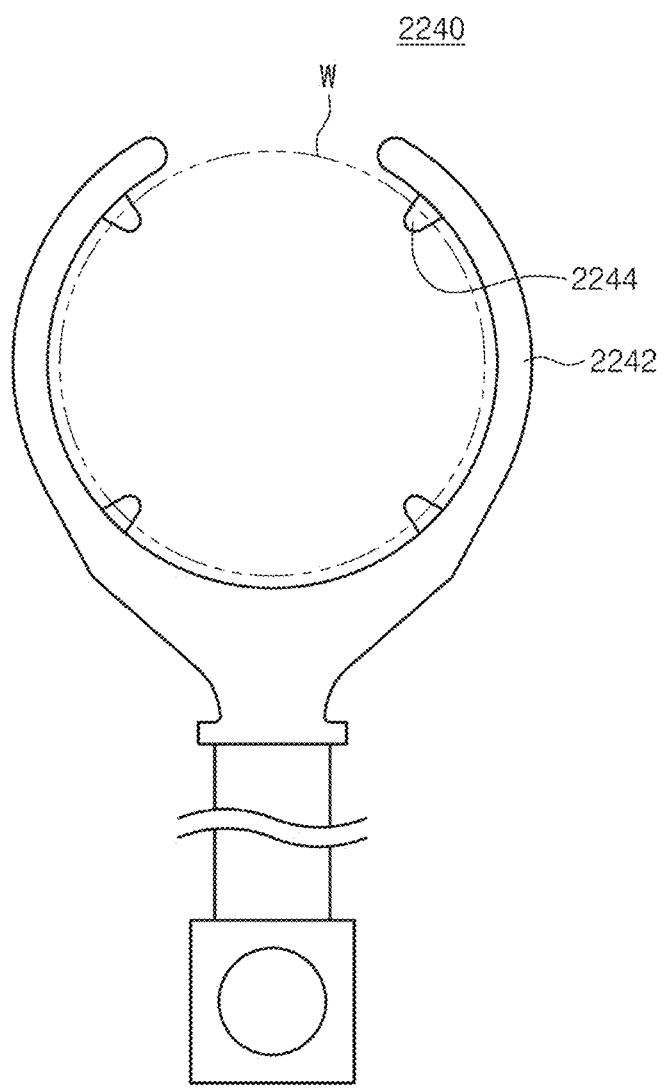
FIG. 5 is a diagram illustrating an example of a hand provided to a transfer chamber of FIG. 4.

Referring to FIG. 5, the coating block 20a includes a transfer chamber 220, a buffer chamber 240, a heat treatment chamber 260, and a process chamber 280 for performing a liquid treatment.

The developing block 20b includes a transfer chamber 220, a buffer chamber 240, a heat treatment chamber 260, and a process chamber 280 for performing a liquid treatment. The transfer chamber 220 provides a space for transferring the substrate W between the buffer chamber 240 and the heat treatment chamber 260, between the buffer chamber 240 and the process chamber 280, and between the heat treatment chamber 260 and the process chamber 280. The buffer chamber 240 provides a space in which the substrate W loaded into the developing block 20b and the substrate W unloaded from the developing block 20b temporarily stay. The heat treatment chamber 260 performs a heat treatment process on the substrate W. The heat treatment process may include a cooling process and a heating process. The process chamber 280 performs the developing process of supplying a developer onto the substrate W to develop the substrate W.

The transfer chamber 220, the buffer chamber 240, the heat treatment chamber 260, and the process chamber 280 of the coating block 20a are provided in a substantially similar structure and arrangement to those of the transfer chamber 220, the buffer chamber 240, the heat treatment chamber 260, the process chamber 280 of the developing block 20b. However, the process chamber 260 of the coating block 20a performing the liquid treatment supplies the liquid onto the substrate W to form a liquid film. The liquid film may be a photoresist film or an antireflection film. Since the coating block 20a is provided in a structure and arrangement substantially similar to that of the developing block 20b, a description thereof will be omitted. Hereinafter, the developing block 20b will be described.

A longitudinal direction of the transfer chamber 220 may be provided in the first direction 2. The transfer chamber 220 is provided with a guide rail 222 and a transfer robot 224. The guide rail 222 is provided in the transfer chamber 220 so that a longitudinal direction is the first direction 2. The transfer robot 244 may be provided to be linearly movable in the first direction 2 on the guide rail 222. The transfer robot 224 returns the substrate W between the buffer chamber 240 and the heat treatment chamber 260, between the buffer chamber 240 and the process chamber 280, and between the heat treatment chamber 260 and the process chamber 280.

According to an example, the transfer robot 224 has a transfer hand 2240 on which the substrate W is placed. The transfer hand 2240 may be provided to be movable forward and backward, rotatable about the third direction 6, and movable along the third direction 6.

FIG. 5 is a diagram illustrating an example of the transfer hand provided to the transfer chamber of FIG. 4. Referring to FIG. 5, the transfer hand 2240 includes a base 2242 and a support protrusion 2244. The base 2242 may have an annular ring shape in which a portion of the circumference is bent. The base 2242 may have a ring shape in which a portion of the circumference is symmetrically bent. The base 2242 has an inner diameter larger than a diameter of the substrate W. The support protrusion 2244 extends inwardly from the base 2242. A plurality of support protrusions 2244 are provided, and supports an edge region of the substrate W. According to an example, four support protrusions 2244 may be provided at equal intervals.

Referring back to FIGS. 4 and 5, a plurality of buffer chambers 240 is provided. Some of the buffer chambers 240 are disposed between the index module 10 and the transfer chamber 220. Hereinafter, the foregoing buffer chambers are referred to as front buffers 242. A plurality of front buffers 242 are provided, and are located to be stacked on each other in the vertical direction. Another portion of the buffer chambers 240 is disposed between the transfer chamber 220 and the interface module 50. Hereinafter, the foregoing buffer chambers are referred to as rear buffers 244. A plurality of rear buffers 244 are provided, and are located to be stacked on each other in the vertical direction. Each of the front buffers 242 and the rear buffers 244 temporarily stores a plurality of substrates W. The substrate W stored in the front buffer 242 is loaded or unloaded by the index robot 144 and the transfer robot 224. The substrate W stored in the rear buffer 244 is loaded or unloaded by the transfer robot 224 and a first robot 5820 which is to be described later.

Buffer robots 2420 and 2440 may be provided on one side of the buffer chamber 240. The buffer robots 2420 and 2440 may include a front buffer robot 2420 and a rear buffer robot 2440. The front buffer robot 2420 may be provided on one side of the front buffer 242. The rear buffer robot 2440 may be provided on one side of the rear buffer 244. The present invention is not limited thereto, and the buffer robots 2420 and 2440 may be provided on both sides of the buffer chamber 240.

The front buffer robot 2420 may transfer the substrate W between the front buffers 242. The front buffer robot 2420 may include a front buffer hand 2422. The front buffer hand 2422 may be moved up and down along the third direction 6. The front buffer hand 2422 may be rotated. The front buffer hand 2422 may transfer the substrate W. The front buffer hand 2422 may load or unload the substrate W to pins 2486 provided on a support plate 2482 which is to be described later. The rear buffer robot 2440 may transfer the substrate W between the rear buffers 244. The rear buffer robot 2440 may include a rear end buffer hand 2442. The configuration of the rear buffer hand 2442 is the same as or similar to that of the front buffer hand 2422. Therefore, a description of the rear buffer hand 2442 will be omitted.

Figure 6:
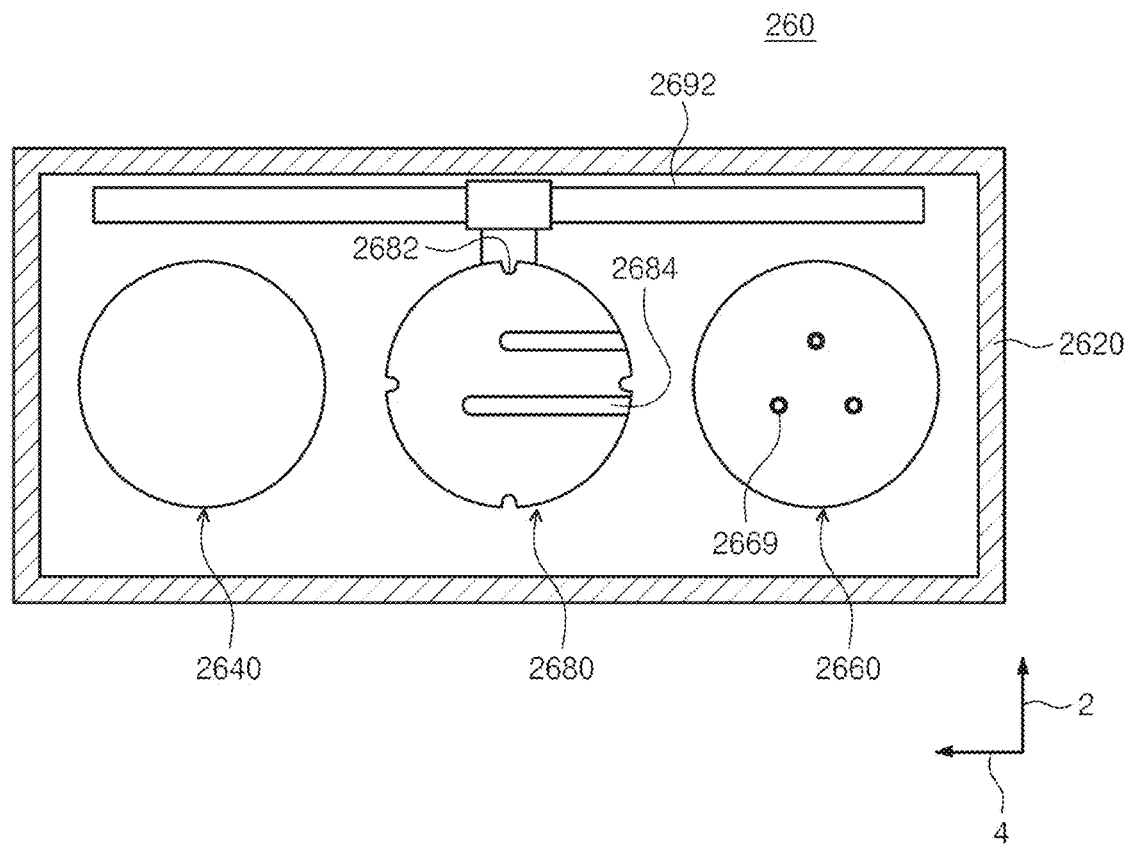
FIG. 6 is a top plan view schematically illustrating an example of a heat treatment chamber of FIG. 4.
Figure 7:
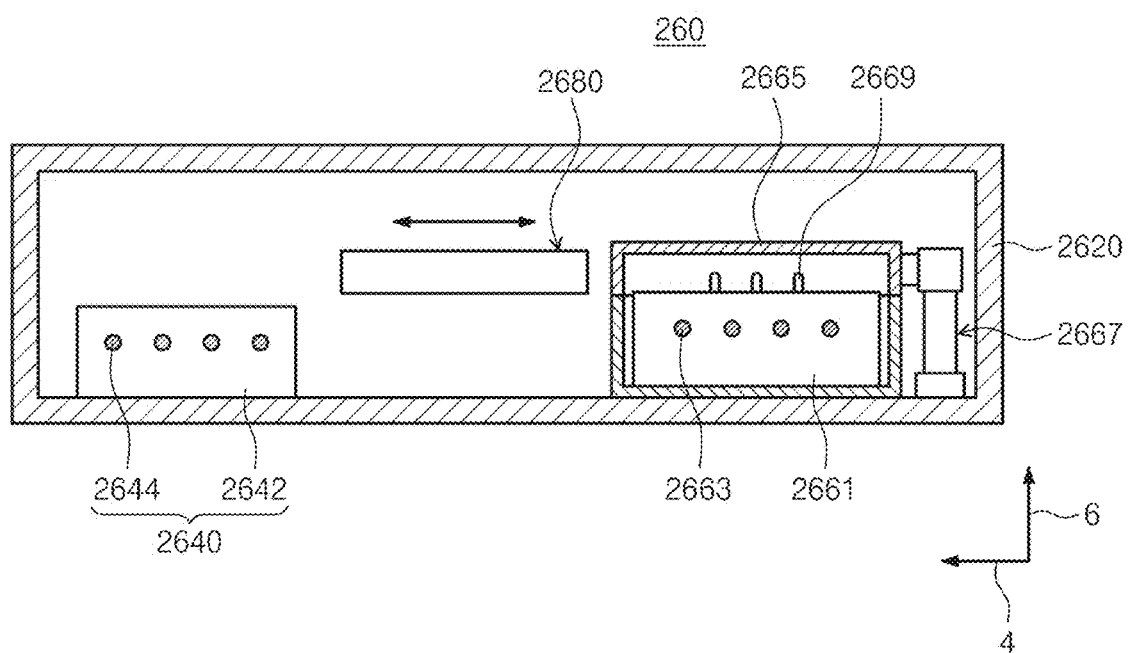
FIG. 7 is a front view of the heat treatment chamber of FIG. 6.

FIG. 6 is a top plan view schematically illustrating an example of the heat treatment chamber of FIG. 4, and FIG. 6 is a front view of the heat treatment chamber of FIG. 6. Referring to FIGS. 6 and 7, a plurality of heat treatment chambers 260 are provided. The heat treatment chambers 260 are disposed along the first direction 2. The heat treatment chambers 260 are located at one side of the transfer chamber 220. The heat treatment chamber 260 includes a housing 2620, a cooling unit 2640, a heating unit 2660, and a transfer plate 2680.

The housing 2620 is provided in the shape of a generally rectangular parallelepiped. The housing 2620 provides space therein. An entrance (not shown) through which the substrate W enters and exits is formed on a side wall of the housing 2620. The entrance may remain open. A door (not shown) may be provided to selectively open and close the entrance. A cooling unit 2640, a heating unit 2660, and a conveying plate 2680 are provided in the inner space of the housing 2620. The cooling unit 2640 and the heating unit 2660 are provided side by side along the second direction 4. According to an example, the cooling unit 2640 may be located relatively closer to the transfer chamber 220 than the heating unit 2660. The cooling unit 2640 includes a cooling plate 2642. The cooling plate 2642 may have a generally circular shape when viewed from above. The cooling plate 2642 is provided with a cooling member 2644. According to an example, the cooling member 2644 is formed inside the cooling plate 2642 and may be provided as a flow path through which a cooling fluid flows.

The heating unit 2660 includes a heating plate 2661, a heater 2663, a cover 2665, and a driver 2667. The heating plate 2661 has a generally circular shape when viewed from above. The heating plate 2661 has a larger diameter than that of the substrate W. A heater 2663 is installed in the heating plate 2661. The heater 3233 may be provided as a heating resistor to which current is applied. The heating plate 2661 is provided with lift pins 2669 drivable in the vertical direction along the third direction 6. The lift pin 2669 receives the substrate W from a transfer means outside the heating unit 2660 and places the received substrate W down on the heating plate 2661 or lifts the substrate W from the heating plate 2661 and hands over the substrate W to the transfer means outside the heating unit 2660. According to an example, three lift pins 2669 may be provided. The cover 2665 has a space with an open lower portion therein. The cover 2665 is located above the heating plate 2661 and is moved up and down by the driver 2667. A space formed by the cover 2665 and the heating plate 2661 according to the movement of the cover 2665 is provided as a heating space for heating the substrate W.

The transport plate 2680 is provided in a substantially disk shape and has a diameter corresponding to that of the substrate W. A notch 2682 is formed at the edge of the transfer plate 2680. The notches 2682 are provided in a number corresponding to that of the support protrusions 2244 formed on the transfer hand 2240 of the transfer robot 224, and are formed at positions corresponding to those of the support protrusions 2244. When the upper and lower positions of the transfer hand 2240 and the transfer plate 2680 are changed in positions where the transfer hand 2240 and the transfer plate 2680 are vertically aligned, the substrate W is transferred between the transfer hand 2240 and the transfer plate 2680. The transfer plate 2680 is mounted on the guide rail 2692, and is movable between a first area 2696 and a second area 2698 along the guide rail 2692 by the driver 2694.

A plurality of slit-shaped guide grooves 2680 is provided in the transfer plate 2684. The guide groove 2684 extends from the end of the transfer plate 2680 to the inside of the transfer plate 2680. A longitudinal direction of the guide grooves 2684 is provided along the second direction 4, and the guide grooves 2684 are located while being spaced apart from each other along the first direction 2. The guide groove 2684 prevents the transfer plate 2680 and the lift pins 2669 from interfering with each other when the substrate W is transferred between the transfer plate 2680 and the heating unit 2660.

Cooling of the substrate W is performed in a state in which the transfer plate 2680 on which the substrate W is placed is in contact with the cooling plate 2642. The transfer plate 2680 is made of a material having high thermal conductivity so that heat transfer is well performed between the cooling plate 2642 and the substrate W. According to an example, the transfer plate 2680 may be made of a metal material.

Referring back to FIGS. 4 and 5, a plurality of process chambers 280 for performing the liquid treatment are provided. Some of the process chambers 280 may be provided to be stacked on each other. The process chambers 280 are disposed at one side of the transfer chamber 220. The process chambers 280 are arranged side by side in the first direction 2.

Figure 8:
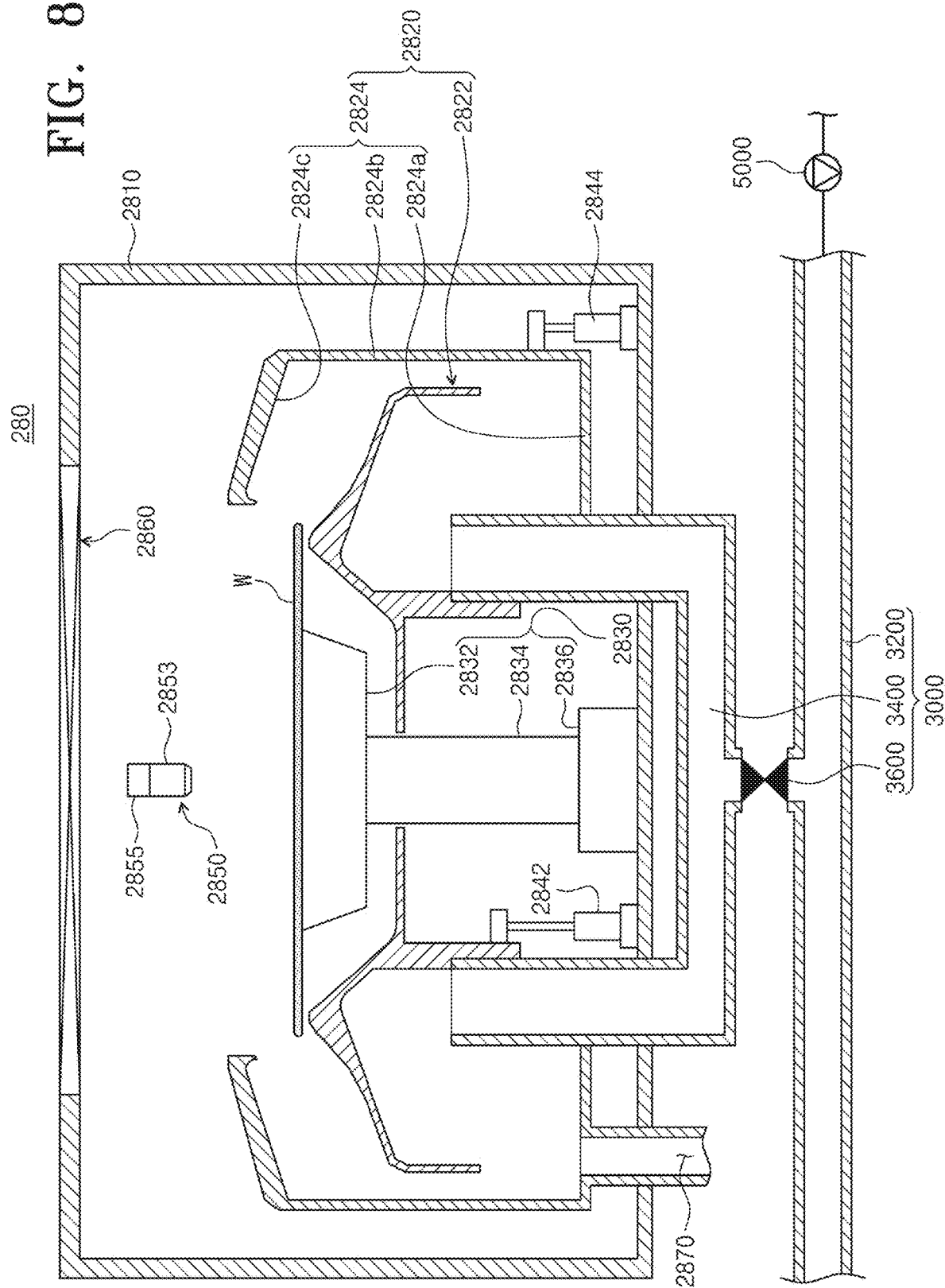
FIG. 8 is a diagram schematically illustrating an exemplary embodiment of a liquid treatment chamber of FIG. 4.

FIG. 8 is a diagram schematically illustrating an exemplary embodiment of the process chamber performing the liquid treatment of FIG. 4. Referring to FIG. 8, the process chamber 280 includes a housing 2810, a treatment container 2820, a support unit 2830, a lifting unit 2840, a liquid supply unit 2850, and an airflow supply unit 2860.

The housing 2810 provides space therein. The housing 2810 is provided in a generally rectangular parallelepiped shape. An opening (not illustrated) may be formed at one side of the housing 2810. The opening functions as an entrance through which the substrate W is loaded into the internal space or the substrate W is unloaded from the internal space. In addition, in order to selectively seal the entrance, a door (not shown) may be installed in an area adjacent to the entrance. The door may seal the inner space by blocking the entrance while the treatment process is performed on the substrate W loaded into the inner space. The treatment container 2820, the support unit 2830, the lifting unit 2840, and the liquid supply unit 2850 are disposed in the housing 2810.

The treatment container 2820 may have a treatment space with an open top. The processing container 2820 may be a bowl having a treatment space. The inner space may be provided to surround the treatment space. The treatment container 2820 may have a cup shape with an open top. The treatment space of the treatment container 2820 may be a space in which the support unit 2830, which will be described later, supports and rotates the substrate W. The treatment space may be a space in which the liquid supply unit 2850 supplies a fluid to treat the substrate W.

According to one example, the treatment container 2820 may include an inner cup 2822 and an outer cup 2824. The outer cup 2824 is provided to surround a circumference of the support unit 2830, and the inner cup 2822 may be located inside the outer cup 2824. Each of the inner cup 2822 and the outer cup 2824 may have an annular ring shape when viewed from above. A space between the inner cup 2822 and the outer cup 2824 may serve as a recovery path through which the fluid introduced into the treatment space is recovered.

The inner cup 2822 may be provided in a shape surrounding a support shaft 2834 of the support unit 2830, which is to be described later, when viewed from above. For example, the inner cup 2822 may be provided in a circular plate shape surrounding the support shaft 2834 when viewed from above. When viewed from above, the inner cup 2822 may be located to overlap an exhaust unit 3000, which is to be described later, coupled to the housing 2810.

The inner cup 2822 may have an inner portion and an outer portion. Upper surfaces of the inner portion and the outer portion may be provided to have different angles from each other based on a virtual horizontal line. For example, when viewed from above, the inner portion may be located to overlap a body 2832 of the support unit 2830 which is to be described later. The inner portion may be located opposite the support shaft 2834. The inner portion may have an upper surface inclined upward as it goes away from the support shaft 2834, and the outer portion may extend outwardly from the inner portion. The outer portion may face a downwardly inclined direction as the upper surface moves away from the support shaft 2834. The upper end of the inner portion may coincide with the side end of the substrate W in the vertical direction. According to an example, the point where the outer portion and the inner portion meet may be a position lower than the upper end of the inner portion. The point where the inner portion and the outer portion meet each other may be provided to be round. The outer portion may be combined with the outer cup 2824 to form a recovery path through which a treatment medium is recovered.

The outer cup 2824 may be provided in a cup shape surrounding the support unit 2830 and the inner cup 2822. The outer cup 2824 may include a bottom portion 2824a, a side portion 2824b, and an inclined portion 2824c.

The bottom portion 2824a may have a circular plate shape having a hollow. A recovery line 2870 may be connected to the bottom portion 2824a. The recovery line 2870 may recover the treatment medium supplied onto the substrate W.

The treatment medium recovered by the recovery line 2870 may be reused by an external recycling system (not shown).

The side portion 2824*b* may have an annular ring shape surrounding the support unit 2830. The side portion 2824*b* may extend in a direction perpendicular to the side end of the bottom portion 2824*a*. The side portion 2824*b* may extend upwardly from bottom portion 2824*a*.

The inclined portion 2824*c* may extend from an upper end of the side portion 2824*b* toward the central axis of the outer cup 2824. An inner surface of the inclined portion 2824*c* may be provided to be inclined upward to approach the support unit 2830. The inclined portion 2824*c* may be provided to have a ring shape. During the treatment processing of the substrate W, the upper end of the inclined portion 2824*c* may be located higher than the substrate W supported by the support unit 2830.

The support unit 2830 supports the substrate W in the treatment space and rotates the substrate W. The support unit 2830 may be a chuck that supports and rotates the substrate W. The support unit 2830 may include a body 2832, a support shaft 2834, and a drive unit 2836. The body 2832 may have an upper surface on which the substrate W is seated. The upper surface of the body 2832 is provided in a generally circular shape when viewed from above. The upper surface of the body 2832 may be provided to have a smaller diameter than the substrate W. A suction hole (not shown) is formed in the body 2832 to chuck the substrate W by a vacuum suction method. Optionally, an electrostatic plate (not shown) may be provided on the body 2832 to chuck the substrate W by an electrostatic adsorption method using static electricity. Optionally, support pins for supporting the substrate W are provided on the body 2832, so that the support pins and the substrate W are in physical contact with each other to chuck the substrate W.

The support shaft 2834 is coupled with the body 2832. The support shaft 2834 may be coupled to a lower surface of the body 2832. The support shaft 2834 may be provided such that the longitudinal direction thereof heads the vertical direction. The support shaft 2834 is provided to be rotatable by receiving power from the driving unit 2836. The support shaft 2834 rotates by rotation of the driving unit 2836 to rotate the body 2832. The driving unit 2836 may vary the rotation speed of the support shaft 2834. The driving unit 2836 may be a motor providing driving force. However, the present invention is not limited thereto, and may be variously modified to a publicly known device providing driving force.

A lifting unit 2840 adjusts the relative height between the treatment container 2820 and the support unit 2830. The lifting unit 2840 linearly moves the treatment container 2820 in the third direction 6. The lifting unit 2840 may include an inner lifting member 2842 and an outer lifting member 2844. The inner lifting member 2842 may move the inner cup 2822 up and down. The outer lifting member 2844 may move the outer cup 2824 up and down.

The liquid supply unit 2850 may include a liquid nozzle 2853, an arm 2855, a rail 2857, and a driver 2859.

Figure 9:
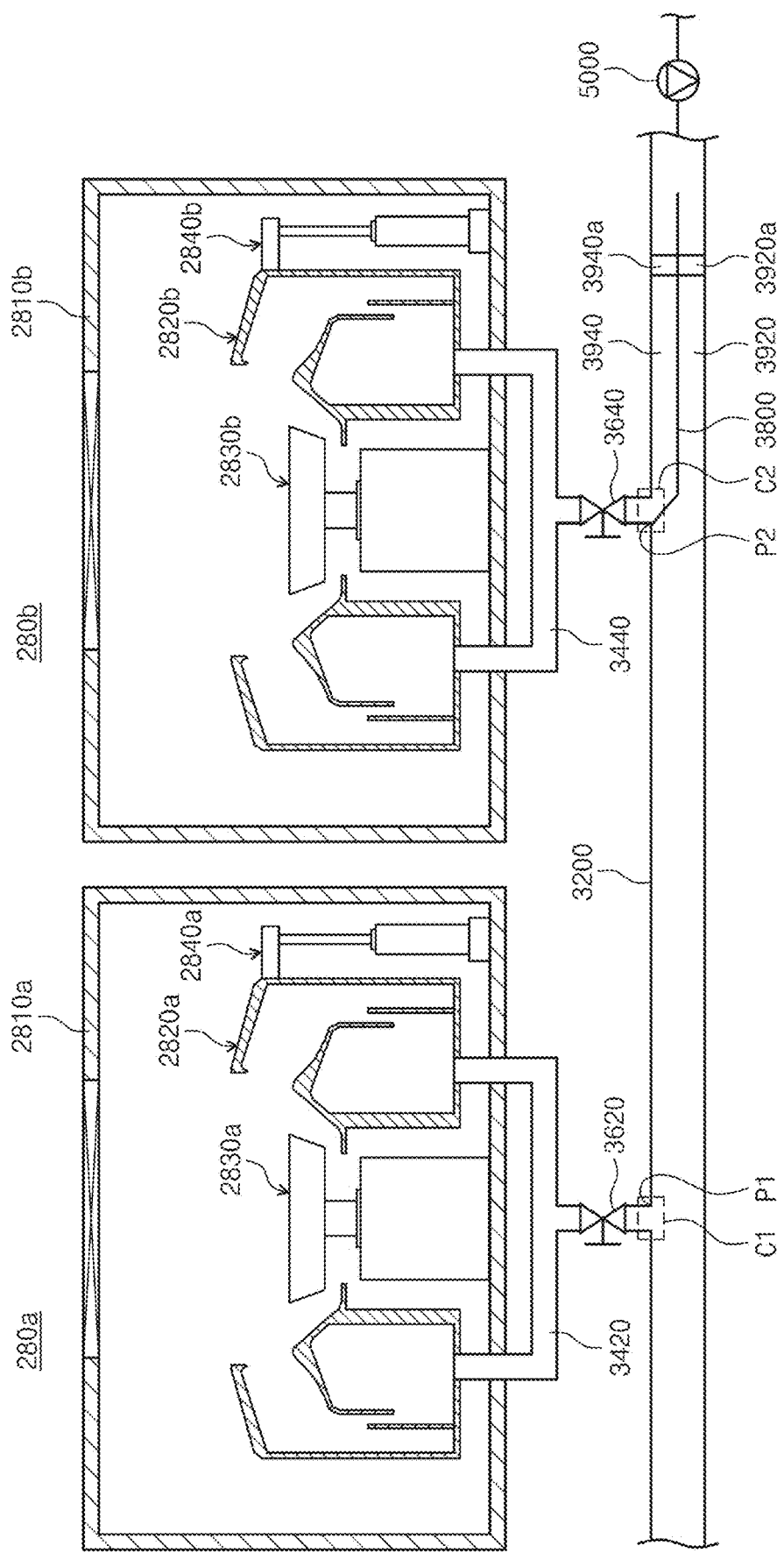
FIG. 9 is a diagram schematically illustrating an exemplary embodiment of an exhaust unit of FIG. 8.

The liquid nozzle 2853 may supply a liquid to the substrate W supported by the support unit 2830. The liquid supplied by the liquid nozzle 2853 to the substrate W may be a developer. Also, the liquid nozzle 2853 may supply deionized water (DIW) to the substrate W supported by the support unit 2830. Also, the liquid nozzle 2853 may supply nitrogen ($N_2$) to the substrate W supported by the support unit 2830. Although it is illustrated in FIG. 9 that the single liquid nozzle 2853 is provided, the present invention is not limited thereto, and a plurality of liquid nozzles 2853 may be provided.

The arm 2855 may support the liquid nozzle 2853. A liquid nozzle 2853 may be installed at one end of the arm 2855. The liquid nozzle 2853 may be installed on a lower surface of one end of the arm 2855. When viewed from above, the liquid nozzle 2853 may be arranged in a direction parallel to the longitudinal direction of the rail 2857 which is to be described later. The other end of the arm 2855 may be coupled to the driver 2859.

The arm 2855 may be moved by the driver 2859. Accordingly, the position of the liquid nozzle 2853 installed on the arm 2855 may be changed. A movement direction of the arm 2855 may be guided along the rail 2857 on which the driver 2859 is installed. The rail 2857 may be provided so that the longitudinal direction faces the horizontal direction. For example, the rail 2857 may be provided so that the longitudinal direction faces a direction parallel to the first direction 2. Optionally, the arm 2855 may be rotated by being coupled to a rotational axis whose longitudinal direction faces the third direction 6. The rotation shaft may be rotated by the driver. Accordingly, the position of the liquid nozzle 2853 installed on the arm 2855 may be changed.

The airflow supply unit 2860 supplies an airflow to the inner space of the housing 2810. The airflow supply unit 2680 may supply a descending airflow to the inner space. The airflow supply unit 2860 may supply the temperature and/or humidity-controlled airflow to the internal space. The airflow supply unit 2680 may be installed in the housing 2810. The airflow supply unit 2680 may be installed above the treatment container 2820 and the support unit 2830. The airflow supply unit 2860 may include a fan 2862, an airflow supply line 2864, and a filter 2866. The airflow supply line 2864 may supply an external airflow whose temperature and/or humidity is controlled to the internal space. The filter 2866 may be installed in the airflow supply line 2864. The filter 2866 may remove impurities contained in the external airflow flowing through the airflow supply line 2864. When the fan 2862 is driven, the external airflow supplied by the airflow supply line 2864 may be uniformly transmitted to the inner space.

The exhaust unit 3000 exhausts the atmosphere of the treatment space. The exhaust unit 3000 may include an integrated exhaust line 3200, an exhaust line 3400, and an exhaust valve 3600.

The integrated exhaust line 3200 may be provided outside the process chamber 280. A decompression unit 5000 is installed in the integrated exhaust line 3200. The decompression unit 5000 provides negative pressure in the integrated exhaust line 3200. Accordingly, the integrated exhaust line 3200 may exhaust the atmosphere inside the treatment space by the decompression unit 5000.

Hereinafter, upstream and downstream are defined based on the exhaust direction within the integrated exhaust line 3200. The exhaust direction in the integrated exhaust line 3200 is determined by the decompression unit 5000. Accordingly, a portion relatively close to the point where the decompression unit 5000 is installed within the integrated exhaust line 3200 is defined as downstream, and a portion relatively far from the point where the decompression unit 5000 is installed within the integrated exhaust line 3200 is defined as upstream.

The exhaust line 3400 may be coupled to the treatment container 2820. As an example, the exhaust line 3400 may be coupled to the bottom portion 2824*a* of the outer cup 2824. When viewed from above, the exhaust line 3400 may be located to overlap the inner cup 2822. The exhaust line 3400 connects the process chamber 280 and the integrated exhaust line 3200. The internal atmosphere of the process chamber 280 is exhausted to the integrated exhaust line 3400 through the exhaust line 3400.

The exhaust valve 3600 may be installed in the exhaust line 3400. The exhaust valve 3600 may open and close the exhaust line 3400. Optionally, the exhaust valve 3600 may adjust the exhaust flow rate of the exhaust line 3400. The exhaust valve 3600 may be provided as an on/off valve or a flow rate control valve. The exhaust valve 3600 is not limited thereto, and various known valves capable of adjusting an exhaust amount may be provided.

Figure 10:
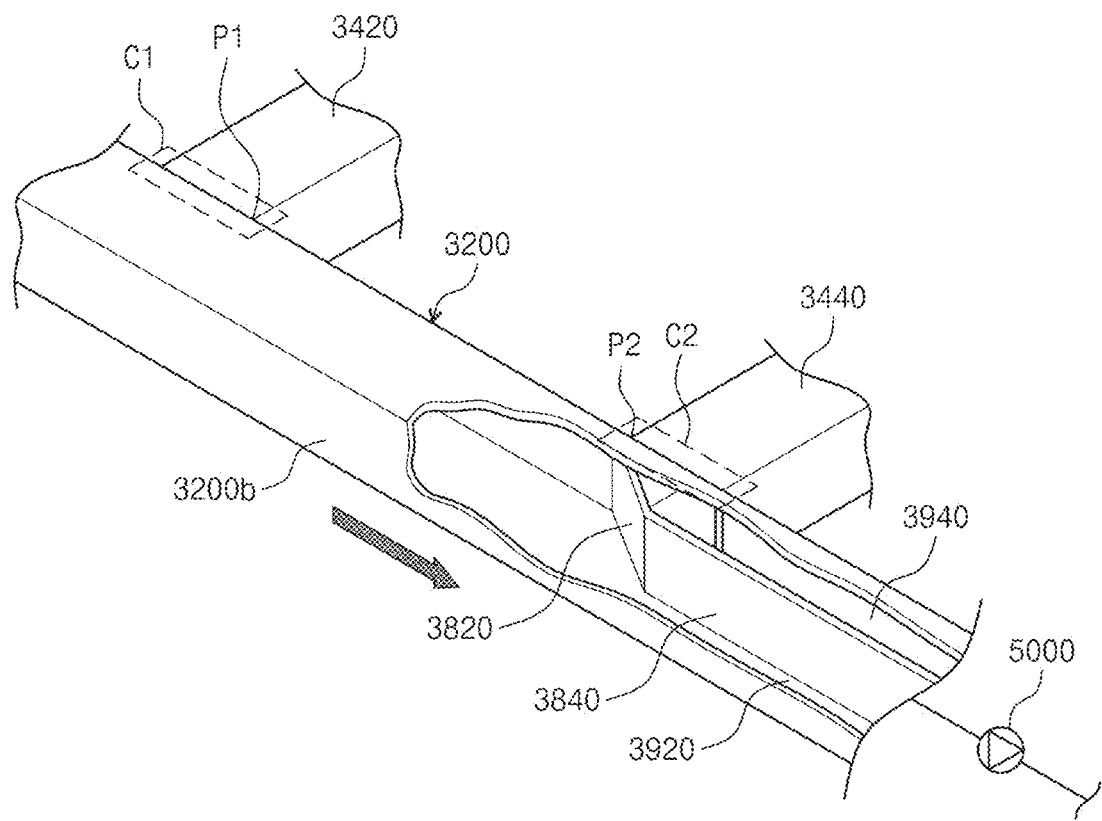
FIG. 10 is an enlarged perspective view of an exemplary embodiment of a partition wall of FIG. 9.

FIG. 9 is a diagram schematically illustrating an exemplary embodiment of the exhaust unit of FIG. 8. FIG. 10 is an enlarged perspective view of an exemplary embodiment of a partition wall of FIG. 9. Referring to FIGS. 9 and 10, a plurality of process chambers 280 may be provided. For example, the process chamber 280 may include a first process chamber 280a and a second process chamber 280b.

The first process chamber 280a includes a first housing 2810a, a first treatment container 2820a, a first support unit 2830a, a first lifting unit 2840a, and a first liquid supply unit 2850a. The second process chamber 280b includes a second housing 2810b, a second treatment container 2820b, a second support unit 2830b, a second lifting unit 2840b, and a second liquid supply unit 2850b.

The housings 2820a and 2820b, the support units 2830a and 2830b, the lifting units 2840a and 2840b, and the liquid supply units 2850a and 2850b are provided similarly to the housing 2820, the support unit 2830, and the lifting unit 2840, the liquid supply unit 3850, and the airflow supply unit 2860 of the exemplary embodiment of FIG. 10, and thus a redundant description thereof will be omitted.

The exhaust unit 3000 exhausts the atmosphere of the treatment space. The exhaust unit 3000 includes an integrated exhaust line 3200, a first exhaust line 3420, a second exhaust line 3440, a first valve 3620, a second valve 3640, a partition wall 3800, a first damper 3920a, and a second damper 3940a.

The integrated exhaust line 3200 may be provided outside the first process chamber 280a and the second process chamber 280b. The decompression unit 5000 is installed in the integrated exhaust line 3200. The decompression unit 5000 provides negative pressure in the integrated exhaust line 3200. Accordingly, the integrated exhaust line 3200 exhausts the atmosphere inside the treatment space by the decompression unit.

A cross-section of the integrated exhaust line 3200 may be provided in a generally quadrangular shape. However, the present invention is not limited thereto, and the cross-section of the integrated exhaust line 3200 may be provided in various shapes. Hereinafter, for convenience of description, a case in which the cross-section of the integrated exhaust line 3200 is provided in a quadrangular shape will be described as an example. The integrated exhaust line 3200 may include a first sidewall 3200a, a second sidewall 3200b, a third sidewall 3200c, and a fourth sidewall 3200d. A first exhaust line 3420 and a second exhaust line 3440, which are to be described later, are connected to the first sidewall. The first sidewall 3200a and the second sidewall 3200b are provided to face each other, and the third sidewall 3200c and the fourth sidewall 3200d are provided to face each other.

One end of the first exhaust line 3420 may be coupled to the first treatment container 2820a. The other end of the first exhaust line 3420 is connected to the integrated exhaust line 3200. The other end of the first exhaust line 3420 may be connected to the first sidewall 3200a. Accordingly, the first exhaust line 3420 connects the first process chamber 280a and the integrated exhaust line 3200. The first exhaust line 3420 may connect the first process chamber 280a and a first connection point C1 of the integrated exhaust line 3200. The internal atmosphere of the first process chamber 280a is exhausted to the integrated exhaust line 3400 through the first exhaust line 3420.

One end of the second exhaust line 3440 may be coupled to the second treatment container 2820b. The other end of the second exhaust line 3440 is connected to the integrated exhaust line 3200. The other end of the second exhaust line 3440 may be connected to the first sidewall 3200a. Accordingly, the second exhaust line 3440 connects the second process chamber 280b and the integrated exhaust line 3200. The second exhaust line 3440 may connect the second process chamber 280b to a second connection point C2 of the integrated exhaust line 3200. The internal atmosphere of the second process chamber 280b is exhausted to the integrated exhaust line 3400 through the second exhaust line 3440.

The first exhaust line 3420, the second exhaust line 3440, and the decompression unit 5000 may be sequentially disposed in the integrated exhaust line 3200. The first exhaust line 3420, the second exhaust line 3440, and the decompression unit 5000 may be disposed along the longitudinal direction of the integrated exhaust line 3200. For example, the first exhaust line 3420, the second exhaust line 3440, and the decompression unit 5000 may be sequentially disposed in a direction from an upstream to a downstream of the integrated exhaust line 3200. For example, the first connection point C1, the second connection point C2, and the decompression unit 5000 may be sequentially disposed in a direction from the upstream to the downstream of the integrated exhaust line 3200.

The first valve 3620 may be installed in the first exhaust line 3420. The first valve 3620 may open and close the first exhaust line 3420. Optionally, the first valve 3620 may adjust the exhaust flow rate of the first exhaust line 3420. The first valve 3620 may be provided as an on/off valve or a flow rate control valve. The present invention is not limited thereto, and the first valve 3620 may be provided as a variety of publicly known valves capable of adjusting the exhaust amount.

The second valve 3640 may be installed in the second exhaust line 3440. The second valve 3640 may open and close the second exhaust line 3440. Optionally, the second valve 3640 may adjust the exhaust flow rate of the second exhaust line 3440. The second valve 3640 may be provided as an on/off valve or a flow rate control valve. The present invention is not limited thereto, and the second valve 3640 may be provided as a variety of publicly known valves capable of adjusting the exhaust amount.

The partition wall 3800 is provided inside the integrated exhaust line 3200. The partition wall 3800 may partition a flow path through which an airflow flows within the integrated exhaust line 3200. The partition wall 3800 may partition a flow path through which an airflow flows within the integrated exhaust line 3200 along the longitudinal direction of the integrated exhaust line 3200. The partition wall 3800 may partition a partial section of the flow path through which the airflow flows within the integrated exhaust line 3200. For example, the partition wall 3800 may be provided up to an upstream point of the integrated exhaust line 3200 rather than a point where the decompression unit 5000 is installed in the integrated exhaust line 3200.

The partition wall 3800 may partition the flow path in the integrated exhaust line 3200 into a first flow path 3920 and a second flow path 3940. The first flow path 3920 may be provided as a flow path through which the airflow exhausted through the first exhaust line 3420 flows. The second flow path 3940 may be provided as a flow path through which the airflow exhausted through the second exhaust line 3440 flows. For example, the first flow path 3920 and the second flow path 3940 may be provided up to the upstream point of the integrated exhaust line 3200 than a point where the decompression unit 5000 is installed in the integrated exhaust line 3200.

The partition wall 3800 may extend from one end to the other end. One end of the partition wall 3800 may be located between the first exhaust line 3420 and the second exhaust line 3440. One end of the partition wall 3800 is in contact with the first sidewall 3200a. One end of the partition wall 3800 may be located between the first connection point C1 and the second connection point C2. One end of the partition wall 3800 may be located to closer to the second point P2 between the first point P1 adjacent to the second exhaust line 3440 among the portions where the first exhaust line 3420 and the first sidewall 3200a are connected and the second point P2 adjacent to the first exhaust line 3420 among the portions where the second exhaust line 3440 and the first sidewall 3200a are connected. One end of the partition wall 3800 may be located at the upstream point of the integrated exhaust line 3200 than the second point P2.

The other end of the partition wall 3800 may be located between the first sidewall 3200a and the second sidewall 3200b. For example, the other end of the partition wall 3800 may be located at an intermediate point of the first sidewall 3200a and the second sidewall 3200b.

The partition wall 3800 may include a first portion 3820 and a second portion 3840. The first portion 3820 extends from one end of the partition wall 3800 that is in contact with the first sidewall 3200a. The first portion 3820 may extend downwardly in a direction from the upstream to the downstream of the integrated exhaust line 3200. For example, the first portion 3820 may extend from one end of the partition wall 3800 to a midpoint between the first sidewall 3200a and the second sidewall 3200b.

The second portion 3840 may extend from the first portion 3820 to the other end of the partition wall 3800. The longitudinal direction of the second portion 3840 may be provided along the exhaust direction of the integrated exhaust line 3200. The second portion 3840 may extend in a direction from the upstream to the downstream of the integrated exhaust line 3200.

In the above-described embodiment, it has been described that the first portion 3820 is provided to be inclined as an example, but the present invention is not limited thereto. The first portion 3820 may extend from one end to the second portion 3840, and may be provided to be rounded to have a curvature in a direction from the first sidewall 3200a to the second sidewall 3200b.

The first damper 3920a may be installed in the first flow path 3920. The first damper 3920a may be installed downstream of the first flow path 3920. The first damper 3920a may adjust the flow rate of the airflow exhausted from the first flow path 3920. The second damper 3940a may be installed in the second flow path 3940. The second damper 3940a may be installed downstream of the second flow path 3940. The second damper 3940a may adjust the flow rate of the airflow exhausted from the second flow path 3940. The flow rate of the airflow exhausted through the first flow path 3920 and the flow rate of the airflow exhausted through the second flow path 3940 may be individually adjusted. Accordingly, the internal atmospheres of the first process chamber 280a and the second process chamber 280b may be independently exhausted.

Figure 11:
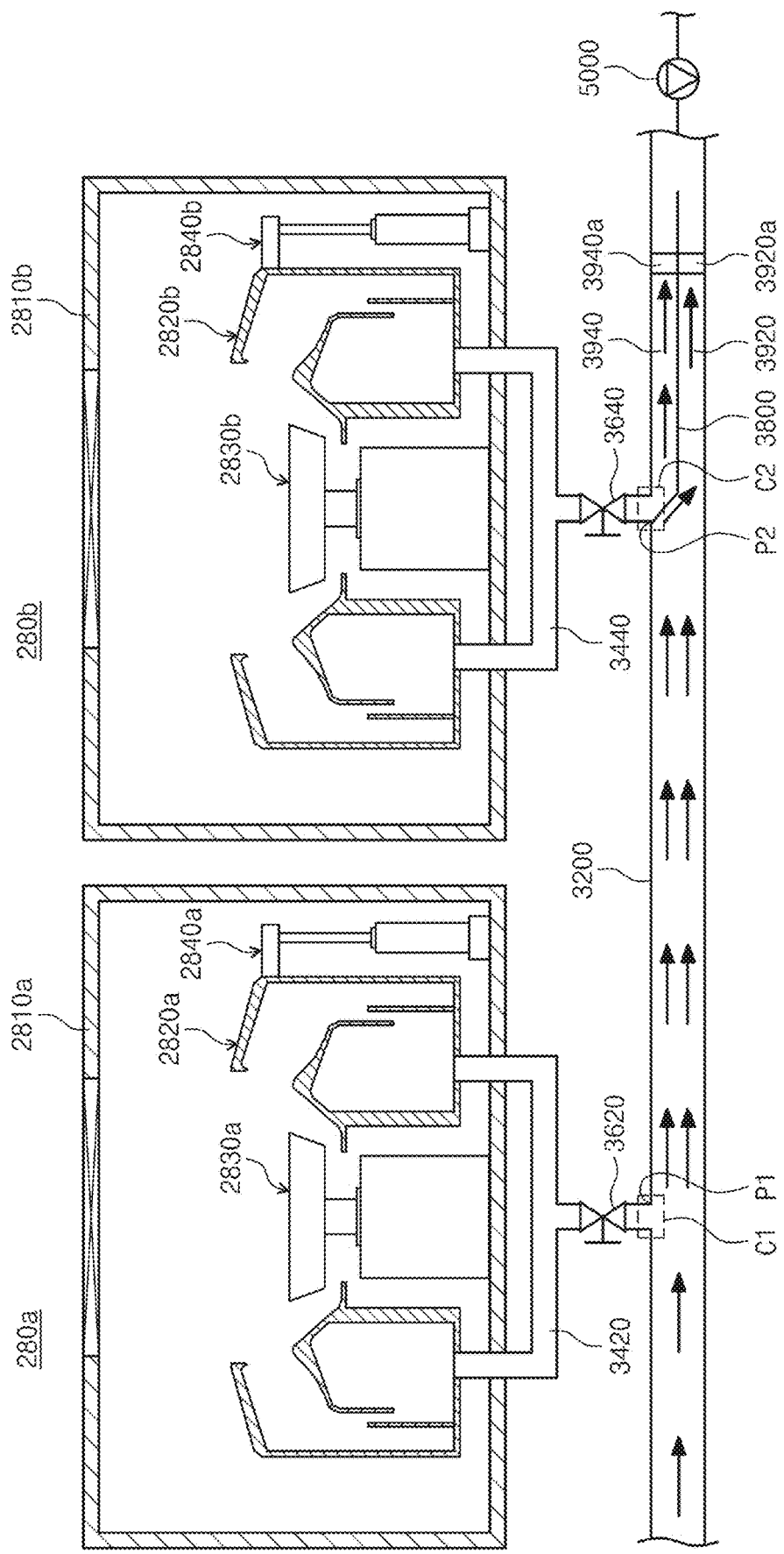
FIG. 11 is a view schematically illustrating a flow of an airflow in the exhaust unit of FIG. 9.

FIG. 11 is a view schematically illustrating a flow of the airflow in the exhaust unit of FIG. 9. Referring to FIG. 11, the first exhaust line 3420, the second exhaust line 3440, and the decompression unit 5000 are sequentially disposed from the upstream to the downstream of the integrated exhaust line 3200. The decompression unit 5000 installed in the integrated exhaust line 3200 is installed in one direction for smooth exhaust in the integrated exhaust line 3200. Inside the integrated exhaust line 3200, the flow of the airflow travels in one direction. That is, the flow of the airflow inside the integrated exhaust line 3200 flows from the upstream to the downstream.

The internal atmosphere of the first process chamber 280a flows into the integrated exhaust line 3200 through the first exhaust line 3420. The internal atmosphere of the first process chamber 280a flows from the upstream to the downstream of the integrated exhaust line 3200. The internal atmosphere of the second process chamber 280b flows into the integrated exhaust line 3200 through the second exhaust line 3440. The internal atmosphere of the second process chamber 280b flows from the upstream to the downstream of the integrated exhaust line 3200.

Accordingly, the exhaust to the integrated exhaust line 3200 through the second exhaust line 3440 is interrupted by the flow of the airflow exhausted from the first process chamber 280a in the integrated exhaust line 3200. The flow of the airflow in the integrated exhaust line 3200 introduced from the first exhaust line 3420 collides with the flow of the airflow in the integrated exhaust line 3200 introduced from the second exhaust line 3440, so that a vortex occurs in the vicinity of the second connection point C2. For this reason, the internal atmosphere of the second process chamber 280b through the second exhaust line 3440 is relatively more difficult to be exhausted than that of the first process chamber 280a. The internal pressure the second process chamber 280b to which the second exhaust line 3440 is connected is varied. The internal atmosphere of the second process chamber 280b is not smoothly exhausted.

According to the exemplary embodiment of the present invention, the integrated exhaust line 3200 is partitioned into the first flow path 3920 and the second flow path 3940 by the partition wall 3800. Since the partition wall 3800 is provided inside the integrated exhaust line 3200, the flow of the airflow exhausted from each of the process chambers 280a and 280b may be independently guided. Accordingly, it is possible to minimize interference of the exhaust of the internal atmosphere of the second process chamber 280b through the second exhaust line 3440 by the flow of the airflow exhausted from the first process chamber 280a. As the exhaust proceeds smoothly, pressure changes caused by the adjacent process chambers in each of the first process chamber 280a and the second process chamber 280b may be minimized. Accordingly, the developing process may be effectively performed in each of the first process chamber 280a and the second process chamber 280b. In addition, the first portion 3820 is provided to be inclined, so that the flow of the airflow in the integrated exhaust line 3200 smoothly flows.

The first exhaust line 3420, the second exhaust line 3440, and the decompression unit 5000 are sequentially disposed in a direction from the upstream to the downstream of the integrated exhaust line 3200, so that the exhaust from the first exhaust line 3420 located relatively far from the decompression unit 5000 does not proceed smoothly. Compared to the second process chamber 280b, the first process chamber 280a is relatively difficult to smoothly exhaust the internal atmosphere. Accordingly, by individually adjusting the exhaust flow rates of the first damper 3920a installed in the first flow path 3920 and the second damper 3940a installed in the second flow path 3940, exhaust efficiency of each of the process chambers 280 may be increased as needed.

In the above-described exemplary embodiment, the case in which the process chamber 280 is provided as the first process chamber 280a and the second process chamber 280b has been described as an example. However, the present invention is not limited thereto, and a plurality of process chambers 280 may be provided. For example, the process chamber 280 may include the first process chamber 280a, the second process chamber 280b, and a third process chamber 280c. When the first process chamber 280a, the second process chamber 280b, the third process chamber 280c, and the decompression unit 5000 are sequentially arranged, the partition wall 3800 may be installed in the vicinity of the portion connected with the exhaust line of the second process chamber 280b in the integrated exhaust line 3200 and the vicinity of the portion connected with the exhaust line of the third process chamber 280c in the integrated exhaust line 3200.

The foregoing detailed description illustrates the present invention. Further, the above content shows and describes the exemplary embodiment of the present invention, and the present invention can be used in various other combinations, modifications, and environments. That is, changes or modifications are possible within the scope of the concept of the invention disclosed herein, the scope equivalent to the written disclosure, and/or within the scope of skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A substrate treating apparatus, comprising:
    a first process chamber having a first treatment space therein;
    a second process chamber having a second treatment space therein; and
    an exhaust unit configured to exhaust atmosphere of the first treatment space and the second treatment space, wherein the exhaust unit includes:
    an integrated exhaust line;
    a first exhaust line connecting the first process chamber and the integrated exhaust line;
    a second exhaust line connecting the second process chamber and the integrated exhaust line;
    a partition wall configured to partition a partial section of a flow path within the integrated exhaust line into a first flow path through which a fluid exhausted through the first exhaust line flows and a second flow path through which a fluid discharged through the second exhaust line flows;
    a first damper configured to adjust an exhaust flow rate of the first flow path independently from the second flow path; and
    a second damper configured to adjust an exhaust flow rate of the second flow path independently from the first flow path,
    wherein the partition wall is configured to partition the flow path of the integrated exhaust line by acting as a partitioning structure such that
        the first flow path is defined by the partition wall on a first side and inner walls of the integrated exhaust line on all other sides, and
        the second flow path is defined by the partition wall on an opposite side and the inner walls of the integrated exhaust line on all other sides,
    wherein a first end of the partition wall is in contact with a first sidewall of the inner walls of the integrated exhaust line between the first exhaust line and the second exhaust line,
    a second end of the partition wall is located between the first sidewall and a second sidewall facing the first sidewall,
    wherein the partition wall includes
        a first portion extending at a first angle from the first sidewall of the inner walls of the integrated exhaust line to contact an end of a second portion, and
        the second portion extends parallel with the inner walls of the integrated exhaust line,
    wherein a sidewall of the first portion of the partition wall faces an opening of the second exhaust line at a second angle, the second exhaust line extending in a direction perpendicular to a surface of the sidewall of the second portion.

2. The substrate treating apparatus of claim 1, wherein the partition wall is configured to partition the first flow path and the second flow path by a predetermined distance along a longitudinal direction of the integrated exhaust line.

3. The substrate treating apparatus of claim 2 further comprising: a decompression unit in the integrated exhaust line,
    wherein the first exhaust line, the second exhaust line, and the decompression unit are sequentially disposed along the longitudinal direction of the integrated exhaust line.

4. The substrate treating apparatus of claim 1, wherein each of the first exhaust line and the second exhaust line is connected to the first sidewall, and
    between a first point adjacent to the second exhaust line among points where the first exhaust line and the first sidewall are connected and a second point adjacent to the first exhaust line among points where the second exhaust line and the first sidewall are connected, the first end of the partition wall is located closer to the second point.

5. The substrate treating apparatus of claim 1, wherein the first portion extends from the first end of the partition wall to a midpoint between the first sidewall and the second sidewall.

6. The substrate treating apparatus of claim 1, wherein each of the first process chamber and the second process chamber are configured to perform a developing process on a substrate.

7. The substrate treating apparatus of claim 1, wherein the first damper is within the first flow path, and the second damper is within the second flow path.

8. The substrate treating apparatus of claim 7, wherein the first damper contacts a first side of the partition wall and one or more the inner walls of the integrated exhaust line, and
    the second damper contacts a second side of the partition wall and one or more of the inner walls of the integrated exhaust line, the second side opposite the first side.

9. A substrate treating apparatus, comprising:
    a first process chamber having a first treatment space;

a second process chamber having a second treatment space;
a transfer robot configured to transfer a substrate to the first process chamber or the second process chamber; and
an exhaust unit configured to exhaust atmosphere of the first treatment space and the second treatment space,
wherein the first process chamber includes:
a first treatment container providing the first treatment space;
a first support unit configured to support and rotate the substrate in the first treatment space; and
a first developer supply unit configured to supply a first developer onto the substrate, and
the second process chamber includes:
a second treatment container providing the second treatment space;
a second support unit configured to support and rotate the substrate in the second treatment space; and
a second developer supply unit configured to supply a second developer on the substrate, and
the exhaust unit includes:
an integrated exhaust line;
a first exhaust line connecting the first process chamber and the integrated exhaust line;
a second exhaust line connecting the second process chamber and the integrated exhaust line;
a partition wall configured to partition a partial section of a flow path within the integrated exhaust line into a first flow path through which a fluid exhausted through the first exhaust line flows and a second flow path through which a fluid exhausted through the second exhaust line flows by a distance along a longitudinal direction of the integrated exhaust line in the integrated exhaust line;
a first damper configured to adjust an exhaust flow rate of the first flow path independently from the second flow path; and
a second damper configured to adjust an exhaust flow rate of the second flow path independently from the first flow path,
wherein the partition wall is configured to partition the flow path of the integrated exhaust line by acting as a partitioning structure such that
the first flow path is defined by the partition wall on one side and inner walls of the integrated exhaust line on all other sides, and
the second flow path is defined by the partition wall on an opposite side and the inner walls of the integrated exhaust line on all other sides,
wherein a first end of the partition wall is in contact with a first sidewall of the inner walls of the integrated exhaust line between the first exhaust line and the second exhaust line,
a second end of the partition wall is located between the first sidewall and a second sidewall facing the first sidewall,
wherein the partition wall includes
a first portion extending at a first angle from the first sidewall of the inner walls of the integrated exhaust line to contact an end of a second portion, and
the second portion extends parallel with the inner walls of the integrated exhaust line,
wherein a sidewall of the first portion of the partition wall faces an opening of the second exhaust line at a second angle, the second exhaust line extending in a direction perpendicular to a surface of the sidewall of the second portion.

10. The substrate treating apparatus of claim 9, wherein a decompression unit configured to provide negative pressure to the integrated exhaust line in the integrated exhaust line, and
the first exhaust line, the second exhaust line, and the decompression unit are sequentially along the longitudinal direction of the integrated exhaust line.

11. The substrate treating apparatus of claim 9, wherein each of the first exhaust line and the second exhaust line is connected to the first sidewall, and
between a first point adjacent to the second exhaust line among points where the first exhaust line and the first sidewall are connected and a second point adjacent to the first exhaust line among points where the second exhaust line and the first sidewall are connected, the first end of the partition wall is located closer to the second point.

12. The substrate treating apparatus of claim 11, wherein the first portion is inclined downward in a direction from an upstream to a downstream of the integrated exhaust line, and
the second portion extends from the first portion in a direction toward the downstream of the integrated exhaust line.

13. The substrate treating apparatus of claim 12, wherein the first portion extends from the first end of the partition wall to a midpoint between the first sidewall and the second sidewall.

14. The substrate treating apparatus of claim 9, wherein the exhaust unit further includes:
a first valve configured to open and close the first exhaust line or configured to adjust the exhaust flow rate of the first flow path; and
a second valve configured to open and close the second exhaust line or configured to adjust the exhaust flow rate of the second flow path.

15. A substrate treating apparatus, comprising:
a first process chamber having a first treatment space therein;
a second process chamber having a second treatment space therein; and
an exhaust unit configured to exhaust atmosphere of the first treatment space and the second treatment space,
wherein the exhaust unit includes:
an integrated exhaust line;
a first exhaust line connecting the first process chamber and the integrated exhaust line;
a second exhaust line connecting the second process chamber and the integrated exhaust line;
a partition wall configured to prevent exhaust interference between the first process chamber and the second process chamber;
a decompression unit in the integrated exhaust line;
the first exhaust line, the second exhaust line, and the decompression unit are sequentially disposed along a longitudinal direction of the integrated exhaust line;
in the integrated exhaust line, a first flow path through which a fluid exhausted through the first exhaust line flows and a second flow path through which a fluid exhausted through the second exhaust line flows;
the partition wall configured to partition a partial section of a flow path within the integrated exhaust line into the first flow path and the second flow path by a predetermined distance along the longitudinal direction of the integrated exhaust line;

a first damper configured to adjust an exhaust flow rate of the first flow path independently from the second flow path; and a second damper configured to adjust an exhaust flow rate of the second flow path independently from the first flow path, wherein the partition wall is configured to partition the flow path of the integrated exhaust line by acting as a partitioning structure such that the first flow path is defined by the partition wall on one side and inner walls of the integrated exhaust line on all other sides, and the second flow path is defined by the partition wall on an opposite side and the inner walls of the integrated exhaust line on all other sides, wherein a first end of the partition wall is in contact with a first sidewall of the inner walls of the integrated exhaust line between the first exhaust line and the second exhaust line, a second end of the partition wall is located between the first sidewall and a second sidewall facing the first sidewall, wherein the partition wall includes a first portion extending at a first angle from the first sidewall of the inner walls of the integrated exhaust line to contact an end of a second portion, and the second portion extends parallel with the inner walls of the integrated exhaust line, wherein a sidewall of the first portion of the partition wall faces an opening of the second exhaust line at a second angle, the second exhaust line extending in a direction perpendicular to a surface of the sidewall of the second portion.

16. The substrate treating apparatus of claim 15, wherein each of the first exhaust line and the second exhaust line is connected to the first sidewall of the inner walls of the integrated exhaust line, the first portion is provided to be inclined downward in a direction from an upstream to a downstream of the integrated exhaust line, and the second portion extends in a direction toward the downstream of the integrated exhaust line.

\* \* \* \* \*